(12) United States Patent
Hew

(10) Patent No.: US 6,665,992 B2
(45) Date of Patent: Dec. 23, 2003

(54) CONCRETE CONSTRUCTION BLOCK AND METHOD FOR FORMING THE SAME

(76) Inventor: Anthony Alexander Hew, 714 E. Orange St., Apopka, FL (US) 32703

( * ) Notice: Subject to any disclaimer, the term of this patent is extended or adjusted under 35 U.S.C. 154(b) by 10 days.

(21) Appl. No.: 09/813,275

(22) Filed: Mar. 20, 2001

(65) Prior Publication Data

US 2002/0134040 A1 Sep. 26, 2002

Related U.S. Application Data (60) Provisional application No. 60/201,832, filed on May 3, 2000, provisional application No. 60/208,205, filed on May 31, 2000, and provisional application No. 60/220,290, filed on Jul. 24, 2000.

(51) Int. Cl.[7] ............................................... E04C 3/30
(52) U.S. Cl. ..................... 52/562; 52/379; 52/410; 52/419; 52/426; 52/431; 52/568
(58) Field of Search .................... 52/424, 462, 562, 52/699, 410, 419, 423, 431, 425, 426, 379, 568

(56) References Cited

U.S. PATENT DOCUMENTS

| | | |
|---|---|---|
| 1,011,753 A | 12/1911 | Crocker et al. |
| 1,240,690 A | 9/1917 | Egloff |
| 2,321,449 A | 6/1943 | Armao |
| 2,669,861 A | 2/1954 | Clutter |
| 2,940,296 A | 6/1960 | Gaspar |
| 4,177,617 A | 12/1979 | DeLuca et al. |
| 5,074,088 A | 12/1991 | Bergeron et al. |
| 5,209,039 A | 5/1993 | Boeshart |
| 5,459,970 A | 10/1995 | Kim |
| 5,845,448 A | 12/1998 | Potvin |
| 5,852,907 A | 12/1998 | Tobin et al. |
| 5,937,604 A | 8/1999 | Bowron |

*Primary Examiner*—Carl D. Friedman
*Assistant Examiner*—Yvonne M. Horton
(74) *Attorney, Agent, or Firm*—Allen, Dyer, Doppelt, Milbrath & Gilchrist, P.A.

(57) ABSTRACT

A concrete construction block includes a pair of opposing spaced apart concrete side panels, a plurality of fasteners carried by the concrete side panels and arranged in pairs, and a plurality of panel couplers extending between respective opposing pairs of fasteners for holding the concrete side panels in an opposing spaced apart relation. Each panel coupler includes a pair of support plates secured to respective fasteners and an attachment member extends between the support plates. The support plates strengthen the concrete construction block under load conditions.

54 Claims, 6 Drawing Sheets

CONCRETE CONSTRUCTION BLOCK AND METHOD FOR FORMING THE SAME

RELATED APPLICATIONS

This application is based upon prior filed copending provisional application No. 60/201,832 filed May 3, 2000, No. 60/208,205 filed May 31, 2000, and No. 60/220,290 filed Jul. 24, 2000, the entire disclosures of which are incorporated herein by reference.

FIELD OF THE INVENTION

The present invention relates to concrete structures, and more particularly, to a concrete construction block for residential and commercial buildings.

BACKGROUND OF THE INVENTION

Construction blocks are typically formed entirely out of concrete, including the interior web-like portion that connects the sides of the construction blocks together. These construction blocks are normally stacked end to end or on top of each other to form concrete walls. To provide extra support when securing roof trusses to these walls, a certain type block is used for the uppermost row of blocks in the walls.

A first type of block is the lintel block. The lintel block is a concrete block that includes a preformed recess in the upper center portion of the block for receiving a reinforcing bar. Concrete is poured into the preformed recess to cover the reinforcing bar. Lintel blocks are easy to form, but lack the necessary strength.

Various alternative blocks have been provided. For example, another type of block is the tie-beam block. Tie-beam blocks are formed by placing plywood along the upper section of the wall, a d suspending a stirrup between the plywood. A plurality of reinforcing bars are attached to the stirrup. Concrete is poured between the plywood to surround the stirrup and the reinforcing bars. Afterwards, the plywood is removed. Tie-beam blocks provide the necessary strength, but are costly and time consuming to form.

Another type of block is disclosed in U.S. Pat. No. 5,209,039 issued to Boeshart. Boeshart discloses a pair of concrete side panels, and a plurality of panel couplers for holding the concrete side panels in a spaced apart relation. The panel couplers include a defined area for receiving a reinforcing bar.

A pair of concrete side panels with fasteners or threaded bolts embedded therein is disclosed in U.S. Pat. No. 1,011,753 issued to Crocker et al. Panel couplers extending the height of each concrete side panel engage the bolts for holding the pair of concrete side panels in a spaced apart relation. Similarly, U.S. Pat. No. 1,240,690 issued to Egloff discloses concrete side panels that include reinforcing rods embedded therein. The ends of the reinforcing bars extend from the inside surface of the concrete side panels to define a fastener, and are used to secure panel couplers for holding the concrete side panels together.

Yet another construction block is disclosed in U.S. Pat. No. 2,669,861 issued to Clutter. Clutter discloses two side panels, one of which is concrete, held in a spaced apart relation using transversely extending wooden panel couplers. The ends of the panel couplers are located in upper and lower slotted portions of the side panels. In particular, the wooden panel couplers have a groove therein for receiving a reinforcing rod.

U.S. Pat. No. 2,669,861 issued to Deluca et al. discloses a construction block comprising a pair of concrete side panels fastened together by panel couplers. The ends of the panel couplers are secured within the concrete side panels. Each panel coupler includes a V-shaped excursion for concentrating water condensation trapped in the space between the concrete side panels, thus permitting the condensation to fall freely downward in the space therebetween.

Notwithstanding the above described construction blocks, there is still a need for a concrete construction block that is easy to form yet provides extra support when securing roof trusses to a concrete wall.

SUMMARY OF THE INVENTION

In view of the foregoing background, it is therefore an object of the present invention to provide a concrete construction block and an associated method for forming the same that is easy to form and provides the necessary strength under load conditions.

This and other objects, features and advantages in accordance with the present invention are provided by a concrete construction block comprising a pair of opposing spaced apart concrete side panels, a plurality of fasteners carried by the concrete side panels and arranged in pairs, and a plurality of panel couplers extending between respective opposing pairs of fasteners for holding the concrete side panels in opposing spaced apart relation. Each panel coupler comprises a pair of support plates secured to respective fasteners and an attachment member extending between the support plates.

The plurality of fasteners in each concrete side panel may include four for example, and are arranged in opposing pairs with respect to the fasteners in the opposing concrete side panel. When the fasteners are arranged as opposing pairs, they may be positioned such that there are two upper opposing pairs of fasteners and two lower opposing pairs of fasteners. Each fastener may include a threaded bolt extending inwardly toward the opposing spaced apart concrete side panel, for example. The support plate of each panel coupler is secured to respective fastener, such as the threaded bolt, for example, with a nut.

The support plate advantageously aides in strengthening the concrete construction block when assembled, particularly when the support plates are positioned in the upper and lower portions of the concrete side panels. In addition, when a roof truss is attached to a reinforcing bar being held by the upper row of concrete construction blocks in a concrete wall, the support plates help to distribute the force exerted by the roof trusses. This is particularly advantageous for commercial and residential building subject to hurricane force winds.

The attachment member for each support plate preferably defines at least one recess for receiving a reinforcing bar, and preferably the at least one recess includes a pair of recesses for receiving a pair of reinforcing bars. When the fasteners are positioned as opposing pairs in the upper and lower portions of the concrete side panels, the plurality of panel couplers include upper panel couplers and lower panel couplers.

In one embodiment, the attachment member for each upper panel coupler defines at least one recess in a first direction for receiving a reinforcing bar, and the attachment member for each lower panel coupler defines at least one recess in a second direction opposite the first direction for receiving a reinforcing bar. This particular arrangement provides a symmetrical layout of the attachment members and of the recesses so that the concrete construction blocks can be placed in either an up or down direction on the concrete wall.

In another embodiment, the attachment member for each upper panel coupler defines at least one recess in a first direction for receiving a reinforcing bar, but the attachment member for the lower panel coupler defines at least one recess also in the first direction for receiving a reinforcing bar. This particular arrangement allows the reinforcing bars to be carried by the recesses in both the upper and lower attachment members.

An alternative embodiment of a concrete construction block comprises a pair of opposing spaced apart concrete side panels, and a plurality of embedded fasteners carried by the concrete side panels and arranged in pairs. Each fastener extends inwardly toward the opposing concrete side panel. A plurality of panel couplers extend between respective pairs of fasteners for holding the concrete side panels in an opposing spaced apart relation. Each panel coupler preferably includes an opening at respective ends thereof for receiving a respective fastener.

The respective ends of each panel coupler may also include a support plate secured thereto for stabilizing the concrete side panels when coupled together. Each panel coupler may be tubular shaped and formed out of fiberglass. Each fastener preferably frictionally engages the opening of a respective panel coupler. Because each fastener frictionally engages the opening in a panel coupler, this allows each concrete construction block to be quickly and easily assembled.

Another aspect of the invention relates to a method for making a concrete construction block comprising the steps of forming a pair of opposing spaced apart concrete side panels, and inserting a plurality of fasteners in the concrete side panels. The plurality of fasteners are arranged in pairs. The method further includes forming a plurality of panel couplers to extend between respective pairs of fasteners for holding the concrete side panels in an opposing spaced apart relation. Each panel coupler comprises a pair of support plates and an attachment member extending between the support plates. The method further includes securing each support plate to a respective fastener for holding the concrete side panels in the opposing spaced apart relation.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Referring initially to FIGS. 1–4, a concrete construction block 10 in accordance with the present invention will now be described. Concrete construction blocks 10 are normally stacked end to end or on top of each other to form a concrete wall 12. To provide extra support to the concrete wall 12 when securing roof trusses 14 thereto, reinforcing bars 16 are used in the uppermost row of the concrete construction blocks. Metal bands or straps 18 are used to secure the roof trusses 14 to the reinforcing bars 16 that run the length of the concrete wall 12. Concrete is also poured through the middle of the concrete construction blocks 10 to strengthen the wall.

The concrete construction block 10 in accordance with the present invention is relatively easy to produce and provides the necessary strength under load conditions. More particularly, the concrete construction block 10 comprises a pair of opposing spaced apart concrete side panels 20. A plurality of fasteners 22 are carried by each concrete side panel 20. These fasteners 22 are arranged in pairs. A plurality of panel couplers 24 extend between respective pairs of fasteners 22 for holding the concrete side panels 20 in an opposing spaced apart relation.

Figure 2:
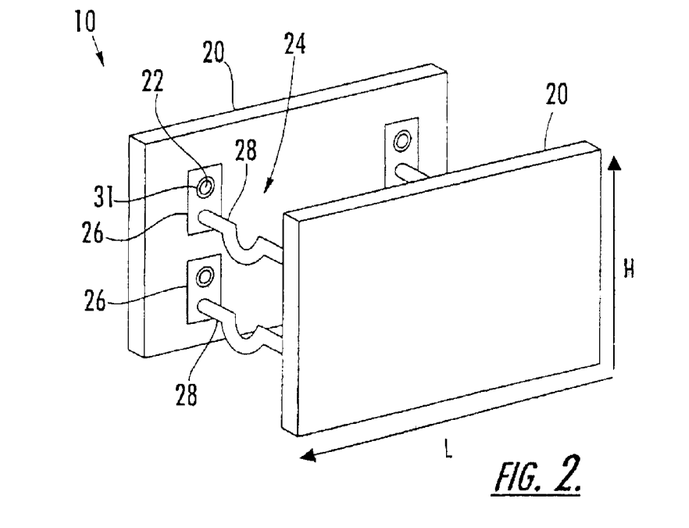
FIG. 2 is a perspective view of a concrete construction block in accordance with the present invention.

There may be four fasteners 22, for example, in each concrete side panel 20. This results in four respective pairs of fasteners 22. Each respective pair of fasteners 22 may be arranged as an opposing pair so that the panel couplers 24 remain substantially parallel to one another, as illustrated in FIG. 2.

Alternatively, each respective pair of fasteners 22 may be staggered or misaligned so that they are not opposing. For example, a first pair of fasteners may include one of the fasteners being positioned in an upper portion of a concrete side panel 20 and the other fastener being positioned in a lower portion of the opposing concrete side panel 20. Within the same concrete construction block 10, a second pair of fasteners may be positioned opposite the first pair of fasteners so that they crisscross one another, i.e., they form an "x" when viewed from the end. In this particular arrangement, the reinforcing bar or bars rest within the "v" of the "x".

Figure 3:
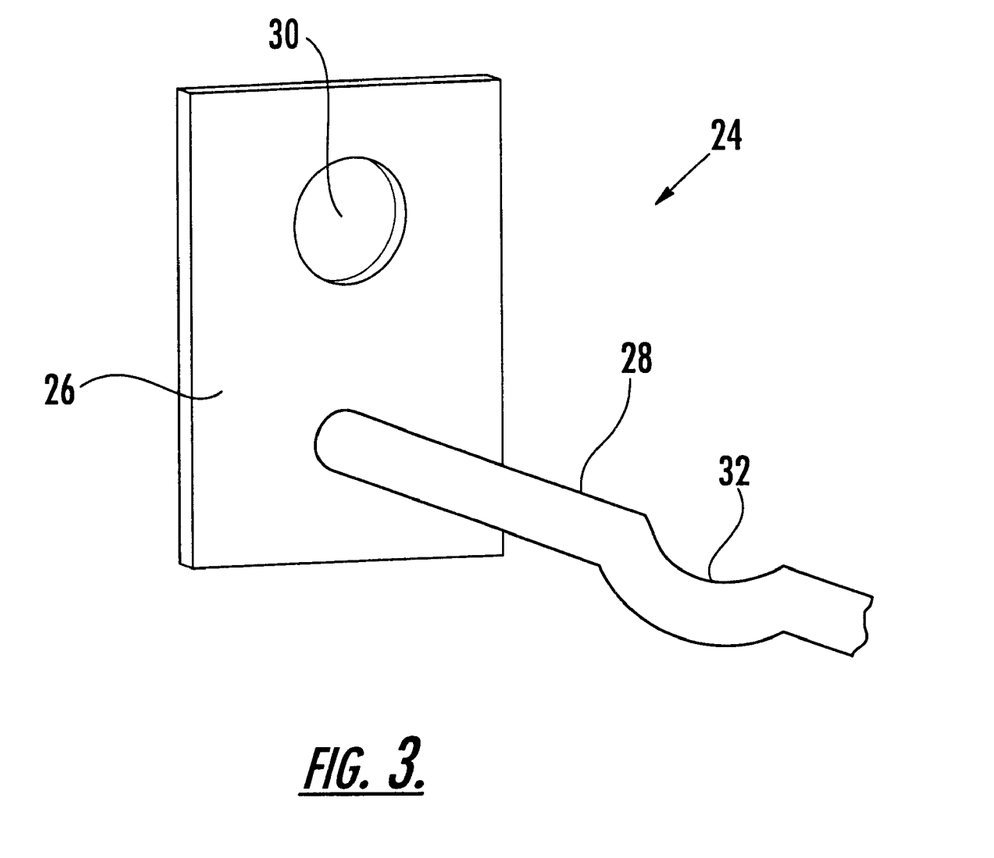
FIG. 3 is a partial perspective view of an end portion of a panel coupler illustrating a support plate and an attachment member in accordance with the present invention.

Each panel coupler 24 comprises a pair of support plates 26 secured to respective fasteners 22, and an attachment member 28 extends between the support plates. A partial perspective view of an end portion of the panel coupler 24 illustrating a support plate 26 and an attachment member 28 is best illustrated in FIG. 3. The attachment member 28 and the support plate 26 are preferably metal, with the support plate being welded to the attachment member. The support plate 26 and the attachment member 28 may also be formed as a single piece, i.e., no welding or attachment is required. In addition to the material of the panel coupler 24 being metal, other material types are readily acceptable, such as fiberglass, for example.

The support plate 26 includes an opening 30 for receiving the fastener 22. In one embodiment, each fastener 22 within a concrete side panel 20 comprises an embedded threaded bolt extending inwardly toward the opposing spaced apart concrete side panel 20, as best show in FIG. 7. The threaded bolt is positioned through the opening 30 in the support plate 26. A nut 31 is used to secure one side of the panel coupler 24 to the concrete side panel 20.

Figure 1:
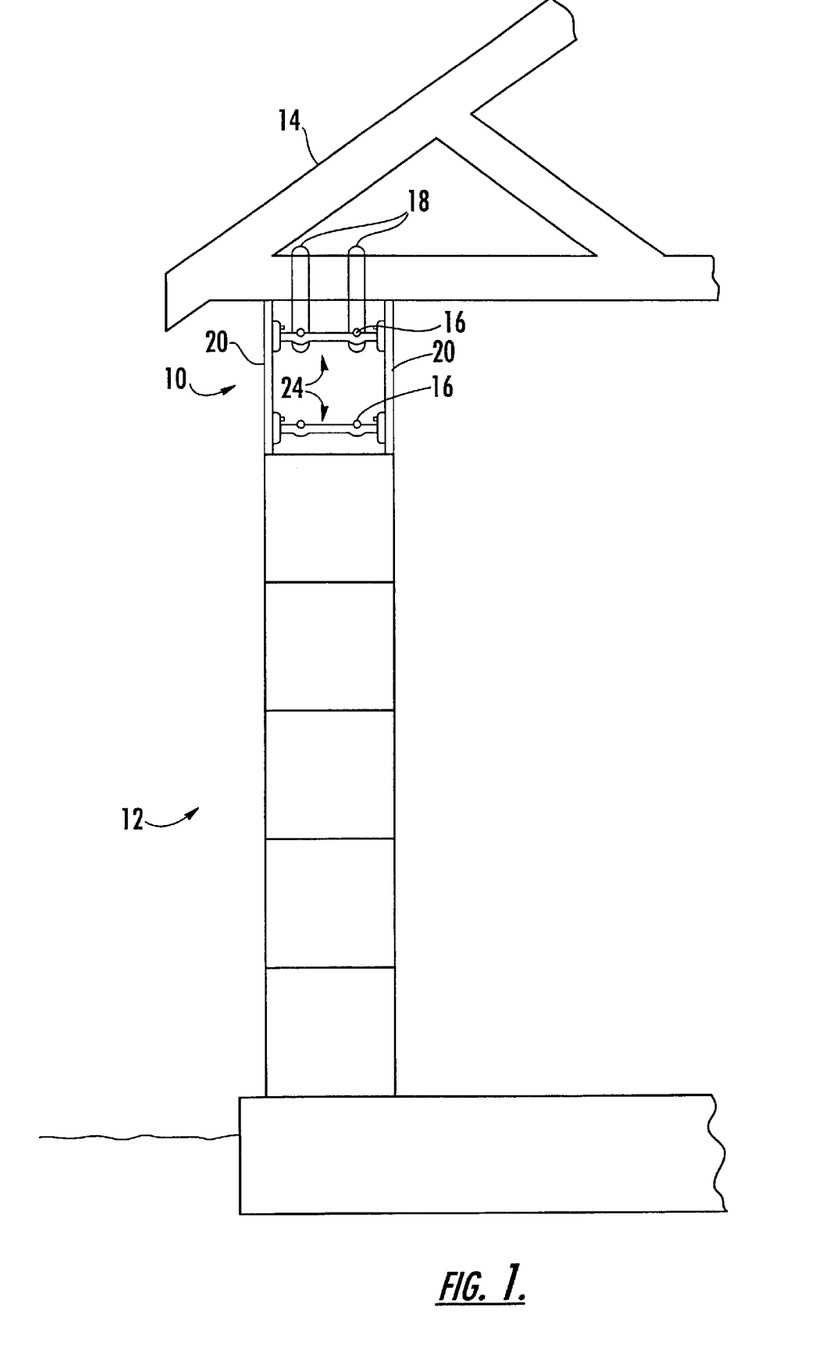
FIG. 1 is a concrete construction block in accordance with the present invention in its intended environment.

The support plate 26 advantageously aids in strengthening the concrete construction block 10 when assembled by causing the force exerted on the block to be distributed across the inner portions of the concrete side panels 20. In addition, when a roof truss 14 is attached to a reinforcing bar 16 being held by the upper row of concrete construction blocks, as shown in FIG. 1, the support plates 26 help to distribute the force exerted by the roof trusses. This is particularly advantageous for commercial and residential buildings subject to hurricane force winds.

Instead of the fasteners 22 being an embedded threaded bolt, the fasteners may be an embedded nut, for example. To assemble the concrete construction block 10, the opening 30 in each support plate 26 is positioned over the embedded nut. A threaded bolt is inserted through the opening 30 of the support plate 26 into the embedded nut and tightened. Other forms of fasteners for securing the panel couplers 24 to the concrete side panels 20 are acceptable.

Each attachment member 28 defines at least one recess 32 for receiving a reinforcing bar 16. In one embodiment, the at least one recess 32 includes a pair of recesses for receiving a pair of reinforcing bars 16. When the fastener pairs are positioned as opposing pairs, and there are upper and lower fastener pairs in each side panel 20, then the panel couplers 24 include an upper panel coupler 24a and a lower panel coupler 24b.

Figure 4A:
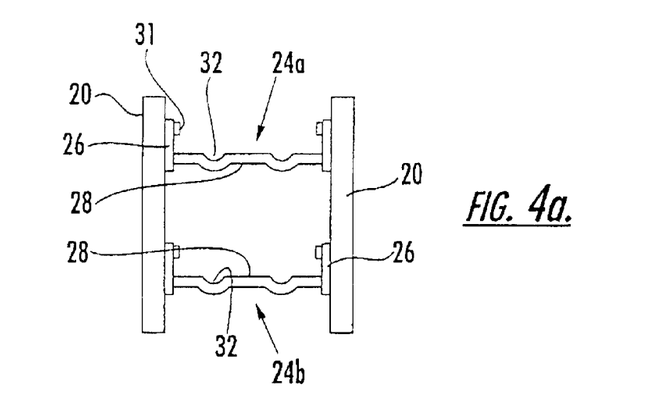
FIG. 4a is a front view of one embodiment of the attachment members in the concrete construction block in accordance with the present invention.

The attachment member 28 for the upper panel coupler 24a defines at least one recess 32 in a first direction for receiving a first reinforcing bar 16, and the attachment member 28 for the lower panel coupler 24b defines at least one recess 32 in a second direction opposite the first direction for receiving a second reinforcing bar, as best shown in FIG. 4a. This particular configuration allows the concrete construction block 10 to be positioned in either the up or down direction because of the symmetry of the recesses 32. The reinforcing bars 16 for the upper couplers 24a rest in the respective recesses 32, while the reinforcing bars for the lower couplers 24b must be tied in place to be held in their respective recess.

Figure 4B:
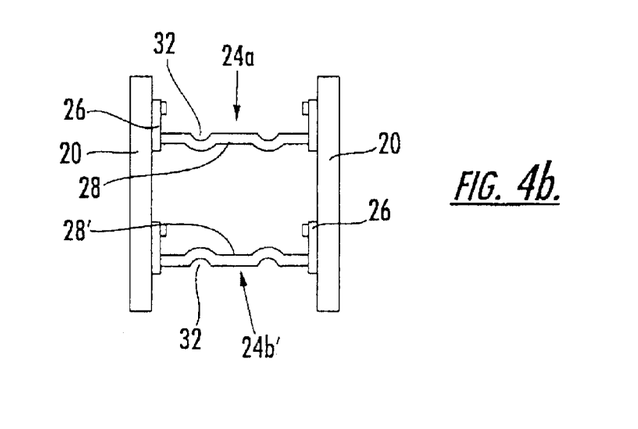
FIG. 4b is a front view of another embodiment of the attachment members in the concrete construction block in accordance with the present invention.

In another embodiment of the attachment members 28, the attachment member for the upper panel coupler 24a defines at least one recess 32 in a first direction for receiving a first reinforcing bar 16, and the attachment member for the lower panel coupler 24b' defines at least one recess 32 also in the first direction for receiving a second reinforcing bar, as best shown in FIG. 4b. This particular configuration results in the reinforcing bars 16 resting in the respective recesses 32 of the upper and lower couplers 24a, 24b'.

Figure 5:
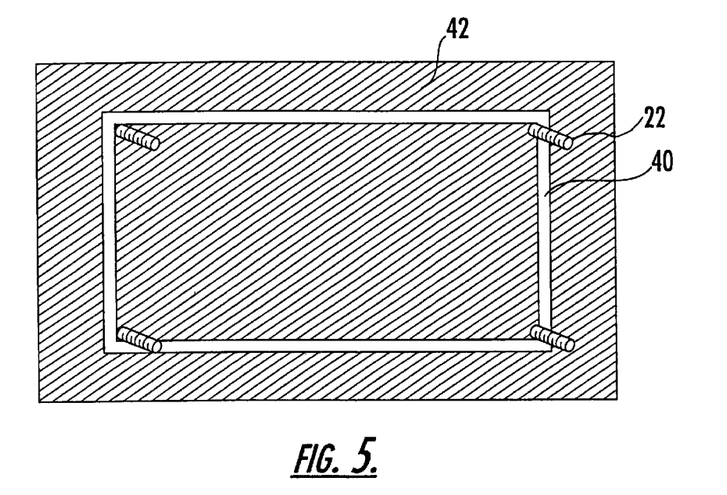
FIGS. 5–7 illustrate the steps for making a concrete side panel in accordance with the present invention.
Figure 6:
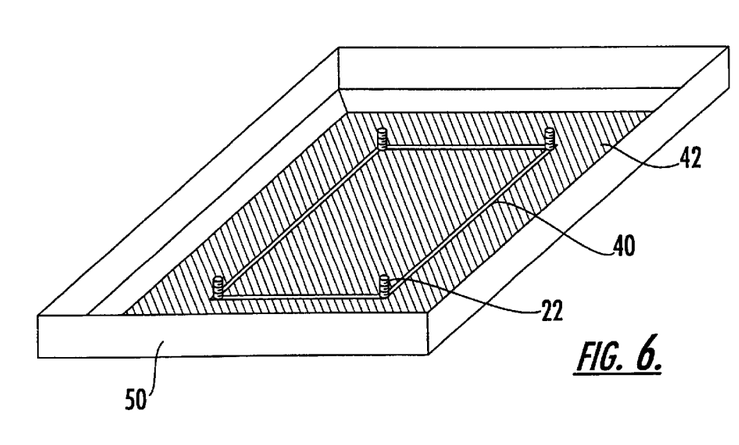
Figure 7:
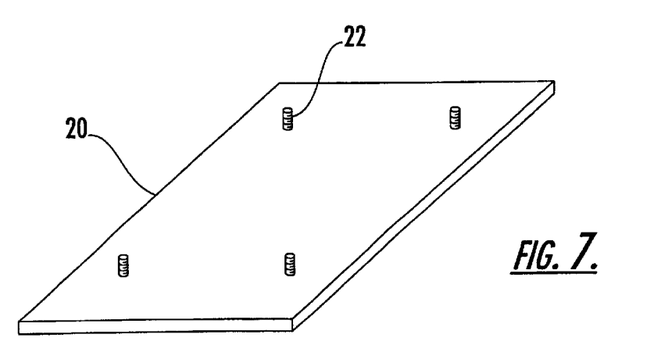

The steps for making a concrete side panel 20 will now be discussed with reference to FIGS. 5–7. A reinforcing frame 40 is formed, and the plurality of fasteners 22 are attached thereto. In the illustrated embodiment, there are four threaded bolt fasteners 22, one for each corner of the reinforcing frame 40. A reinforcing wire mesh 42 is attached to the reinforcing frame 40, as best shown in FIG. 5. The reinforcing wire mesh 42 and the reinforcing frame 40 are then placed in a mold 50 that receives concrete, as best shown in FIG. 6. After the concrete dries, a concrete side panel 20 is formed with the fasteners 22 extending inwardly therefrom, as best shown in FIG. 7.

Example dimensions for a concrete side panel 20 are about 16 inches in length (in a first direction) by about 8 inches in height (in a second orthogonal direction). A thickness of the concrete side panel is about 1 inch. The overall width of a concrete construction block 10 with the panel couplers 24 being secured in place is about 8 inches. The attachment members 28 are about 1 inch in width by about 2 inches in height. These dimensions are for illustrative purposes only, and other dimensions conforming to industry standards are readily acceptable. For example, the panel couplers 24 may be adjustable so that the width of the concrete construction block 10 varies to a desired width. Moreover, if the concrete construction blocks 20 are used as footers under a foundation to support a concrete wall 12, then the dimensions of the concrete construction blocks may be larger than those blocks used to form the wall.

Figure 8:
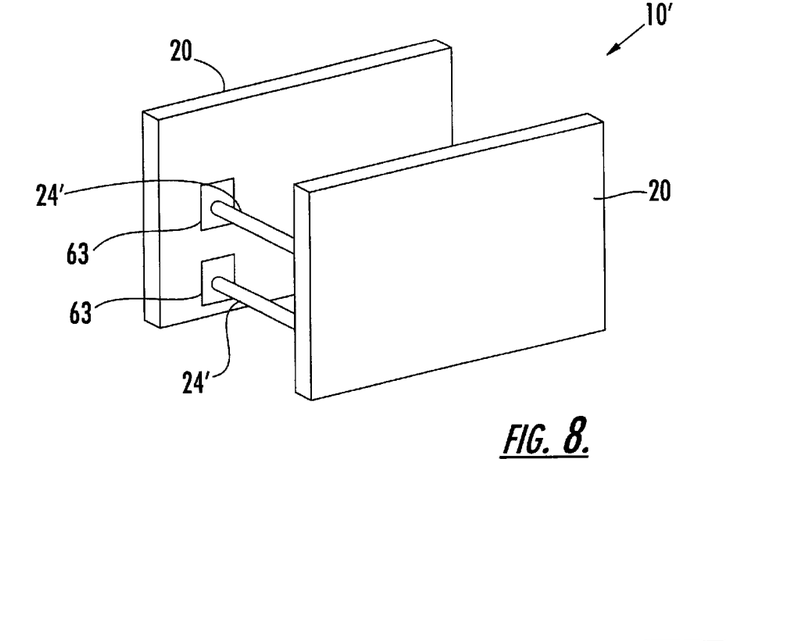
FIG. 8 is a perspective view of another embodiment of the concrete construction block in accordance with the present invention.
Figure 9:
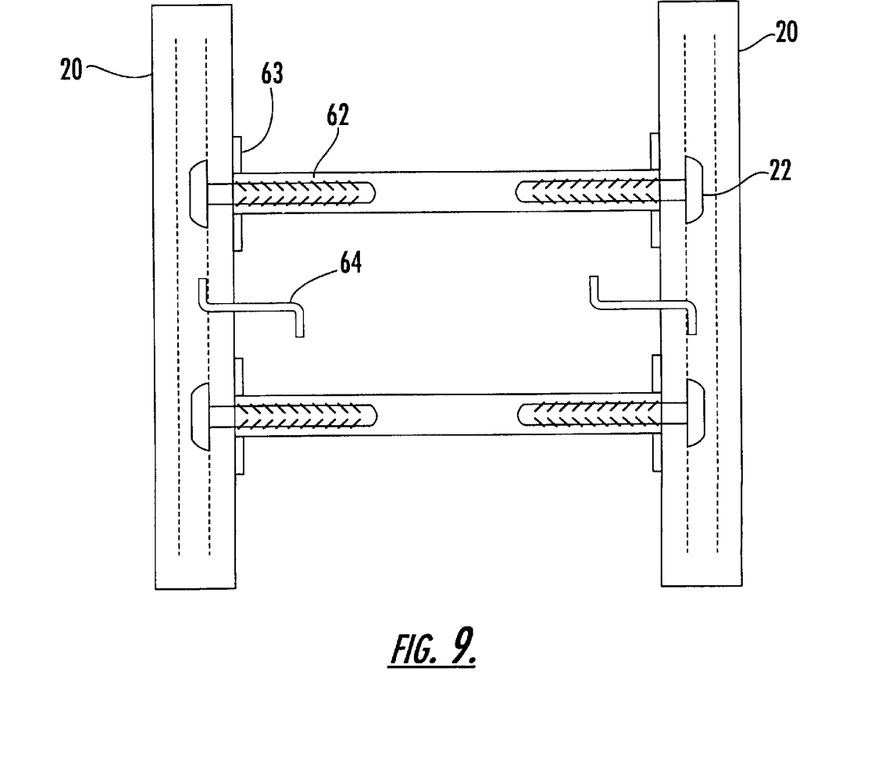
FIG. 9 is a front sectional view of the concrete construction block illustrated in FIG. 8.
Figure 10:
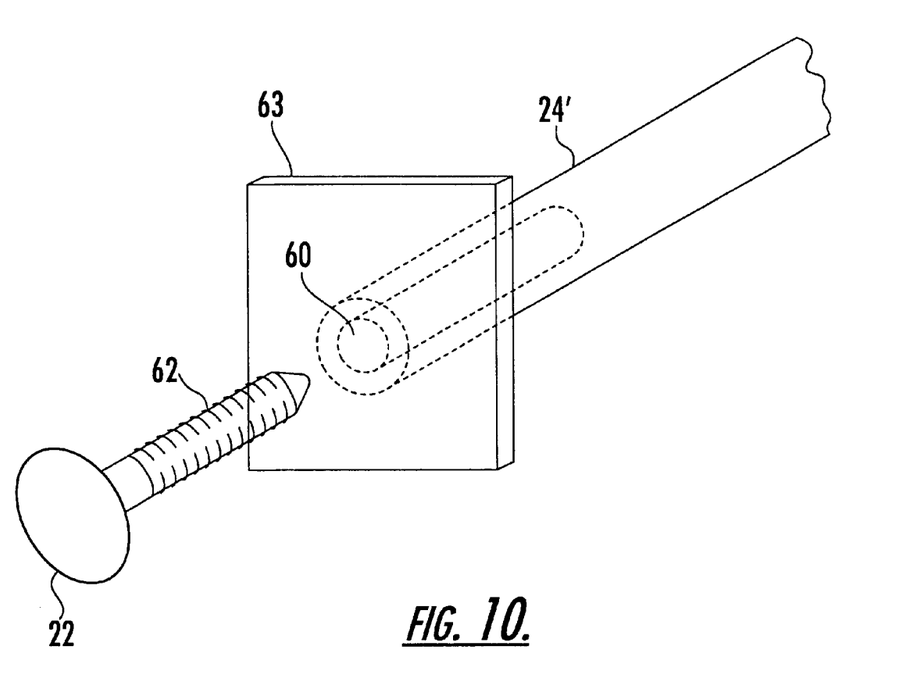
FIG. 10 is a partial perspective view of a fastener and an end portion of a panel coupler for the concrete construction block illustrated in FIG. 8.

Another embodiment of the concrete construction block 10' will now be discussed with reference to FIGS. 8–10. The concrete construction block 10' comprises a pair of opposing spaced apart concrete side panels 20. A plurality of embedded fasteners 22 are carried by the concrete side panels 20 and are arranged in pairs. Each fastener 22 is directed inwards, i.e., toward the opposing concrete side panel 20.

The concrete construction block 10' further includes a plurality of panel couplers 24' extending between respective pairs of fasteners 22 for holding the concrete side panels 20 in an opposing spaced apart relation. Each panel coupler 24' includes an opening 60 at respective ends thereof for receiving a fastener 22, as best illustrated in FIG. 10. A support plate 63 may also be secured to the respective ends of each panel coupler 24' for stabilizing the concrete side panels 20. Each support plates 63 includes an opening through which the respective end of a panel coupler 24' extends therethrough. The support plate 63 is secured to the end of panel coupler 24' using glue, for example.

The panel couplers 24' and the support plates 63 may be made from fiberglass, for example. The fasteners 22 may be made out of nylon, and include flexible edges 62 so that they slidably engage the opening 60 at the end of a panel coupler 24'. Each concrete side panel 20 may be formed as discussed with reference to FIGS. 5–7. Each concrete side panel 20 may further include at least one concrete hook 64. The concrete hooks 64 adhere to the concrete poured between the opposing side panels 20 after the concrete construction block 10' has been formed.

Another aspect of the invention relates to a method for making a concrete construction block 10 comprising the steps of forming a pair of opposing spaced apart concrete side panels 20, and inserting a plurality of fasteners 22 in the concrete side panels. The fasteners 22 may be arranged in opposing pairs.

The method further includes forming a plurality of panel couplers 24, each comprising a pair of support plates 26 to be secured to respective fasteners 22, and an attachment member 28 extends between the support plates. The plurality of panel couplers 24 between respective opposing pairs of fasteners 22 hold the concrete side panels 20 in an opposing spaced apart relation.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A concrete construction block comprising:

a pair of opposing spaced apart concrete side panels, each concrete side panel extending in a first direction and a second orthogonal direction;

a plurality of fasteners carried by said concrete side panels and arrange in opposing pairs in the first direction and in the second direction; and a respective panel coupler extending between each opposing pair of fasteners for holding said pair of concrete side panels in the opposing spaced apart relation, said respective panel couplers being arranged in pairs in the first direction and in the second direction, each panel coupler comprising a pair of support plates secured to its respective opposing pair of fasteners and an attachment member extending between said pair of support plates, each support plate being positioned inwardly from a periphery of a respective concrete side panel.

2. A concrete construction block according to claim 1, wherein said plurality of fasteners in each concrete side panel comprises four.

3. A concrete construction block according to claim 1, wherein each fastener comprises a threaded bolt extending inwardly toward the opposing spaced apart concrete side panel.

4. A concrete construction block according to claim 3, further comprising a plurality of nuts for engaging respective threaded bolts.

5. A concrete construction block according to claim 1, wherein each attachment member defines at least one recess for receiving a reinforcing bar.

6. A concrete construction block according to claim 1, wherein said opposing pairs of fasteners comprises at least one upper opposing pair of fasteners in an upper portion of said respective concrete side panels, and at leapt one lower opposing pair of fasteners in a lower portion of said respective concrete side panels.

7. A concrete construction block according to claim 6, wherein said plurality of panel couplers comprises:

at least one upper panel coupler for said at least one upper opposing pair of fasteners, with said respective attachment member defining at least one recess in a first direction for receiving a first reinforcing bar; and at least one lower panel coupler for said at least one lower opposing pair of fasteners, with said respective attachment member defining at least one recess in a second direction opposite the first direction for receiving a second reinforcing bar.

8. A concrete construction block according to claim 6, wherein said plurality of panel couplers comprises:

at least one upper panel coupler for said at least one upper opposing pair of fasteners, with said respective attachment member defining at least one recess in a first direction for receiving a first reinforcing bar; and at least one lower panel coupler for said at least one lower opposing pair of fasteners, with said respective attachment member defining at least one recess in the first direction for receiving a second reinforcing bar.

9. A concrete construction block according to claim 1, wherein each concrete side panel comprises a reinforcing wire mesh therein.

10. A concrete construction block according to claim 9, wherein each concrete side panel comprises a reinforcing frame adjacent said wire mesh; and wherein said plurality of fasteners are attached to said reinforcing frame.

11. A concrete construction block comprising:

a pair of opposing spaced apart concrete side panels;

a plurality of fasteners carried by said concrete side panels including plurality of upper opposing pairs of fasteners in an upper portion of each side panel, and a plurality of lower opposing pairs of fasteners in a lower portion of each side panel; and a respective upper panel coupler extending between each upper opposing pair of fasteners, and a respective lower panel coupler extending between each lower opposing pair of fasteners for holding said pair of concrete side panels in the opposing spaced apart relation, each panel coupler comprising a pair of support plates secured to its respective opposing pair of fasteners and an attachment member extending between said pair of support plates, each support plate being positioned inwardly from a periphery surface of a respective concrete side panel.

12. A concrete construction block according to claim 11, wherein said plurality of fasteners in each concrete side panel comprises four.

13. A concrete construction block according to claim 11, wherein each fastener comprises a threaded bolt extending inwardly toward the opposing spaced apart concrete side panel.

14. A concrete construction block according to claim 13, further comprising a plurality of nuts for engaging respective threaded bolts.

15. A concrete construction block according to claim 11, wherein each attachment member defines at least one recess for receiving a reinforcing bar.

16. A concrete construction block according to claim 11, wherein the attachment member for said at least one upper panel coupler defines at least one recess in a first direction for receiving a first reinforcing bar, and the attachment member for said at least one lower panel coupler defines at least one recess in a second direction opposite the first direction for receiving a second reinforcing bar.

17. A concrete construction block according to 11, wherein the attachment member for said at least one upper panel coupler defines at least one recess in a first direction for receiving a first reinforcing bar, and the attachment member for said at least one lower panel coupler defines at least one recess in the first direction for receiving a second reinforcing bar.

18. A concrete construction block according to claim 11, wherein each concrete side panel comprises a reinforcing wire mesh therein.

19. A concrete construction block according to claim 18, wherein each concrete side panel comprises a reinforcing frame adjacent said wire mesh; and wherein said plurality of fasteners are attached to said reinforcing frame.

20. A concrete construction block comprising:

a pair of opposing spaced apart concrete side panels, each concrete side panel extending in a first direction and a second orthogonal direction;

a plurality of embedded fasteners carried by said concrete side panels a d arranged in opposing pairs in the first direction and in the second direction, each fastener extending inwardly toward the opposing concrete side panel; and a respective panel coupler extending between each opposing pair of fasteners for holding said pair of concrete side panels in the opposing spaced apart relation, said respective panel couplers being arranged in pairs in the first direction and in the second direction, each panel coupler includes an opening at its respective ends thereof for receiving a respective fastener.

21. A concrete construction block according to claim 20, further comprising a support plate secured to the respective ends of each panel coupler.

22. A concrete construction block according to claim 20, wherein each panel coupler is tubular shaped.

23. A concrete construction block according to claim 20, wherein each panel coupler comprises fiberglass.

24. A concrete construction block according to claim 20, wherein each fastener frictionally engages the opening of a respective panel coupler.

25. A concrete construction block according to claim 20, wherein each fastener comprises nylon.

26. A concrete construction block according to claim 20, wherein said plurality of fasteners in each concrete side panel comprises four.

27. A concrete construction block according to claim 20, wherein said opposing pairs of fasteners comprises at least one upper opposing pair of fasteners in an upper portion of said respective concrete side panels, and at least one lower opposing pair of fasteners in a lower portion of said respective concrete side panels.

28. A concrete construction block according to claim 20, wherein each concrete side panel comprises a reinforcing wire mesh therein.

29. A concrete construction block according to claim 28, wherein each concrete side panel comprises a reinforcing frame adjacent said wire mesh; and wherein said plurality of fasteners are attached to said reinforcing frame.

30. A method for making a concrete construction lock comprising:
  forming a pair of opposing spaced apart concrete side panels, each concrete side panel extending in a first direction and a second orthogonal direction;
  inserting a plurality of fasteners in the concrete side panels, the plurality of fasteners being arranged in opposing pairs in the first direction and in the second direction;
  forming a respective panel coupler extending between each opposing pair of fasteners for holding the pair of concrete side panels in the opposing spaced apart relation, the respective panel couplers being arranged in pairs in the first direction and in the second direction, each panel coupler comprising a pair of support plates and an attachment member extending between the pair of support plates, each support plate being positioned inwardly from a periphery surface of a respective concrete side panel; an
  securing each support plate to its respective opposing pair of fasteners for holding the concrete side panels in the opposing spaced apart relation.

31. A method according to claim 30, wherein the plurality of fasteners in each concrete side panel comprises four.

32. A method according to claim 30, wherein each fastener comprises a threaded bolt extending inwardly toward the opposing spaced apart concrete side panel.

33. A method according to claim 32, wherein securing comprises tightening a nut against each respective threaded bolt.

34. A method according to claim 30, wherein each attachment member defines at least one recess for receiving a reinforcing bar.

35. A method according to claim 30, wherein the opposing pairs of fasteners comprises at least one upper opposing pair of fasteners in an upper portion of the respective concrete side panels, and at least one lower opposing pair of fasteners in a lower portion of the respective concrete side panels.

36. A method according to claim 35, wherein the plurality of panel couplers comprises:
  at least one upper panel coupler for the at least one upper opposing pair of fasteners, with the respective attachment member defining at least one recess in a first direction for receiving a first reinforcing bar; and
  at least one lower panel coupler for the at least one lower opposing pair of fasteners, with the respective attachment member defining at least one recess in a second direction opposite the first direction for receiving a second reinforcing bar.

37. A method according to claim 35, wherein the plurality of panel couplers comprises:
  at least one upper panel coupler for the at least one upper opposing pair of fasteners, with the respective attachment member defining at least one recess in a first direction for receiving a first reinforcing bar; and
  at least one lower panel coupler for the at least one lower opposing pair of fasteners, with the respective attachment member defining at least one recess in the first direction for receiving a second reinforcing bar.

38. A method according to claim 30, wherein forming the pair of opposing spaced apart concrete side panels comprises forming a reinforcing wire mesh in each side panel.

39. A method according to claim 30, wherein forming the pair of opposing spaced apart concrete side panels further comprises forming a reinforcing frame adjacent each reinforcing wire mesh.

40. A method according to claim 39, wherein inserting the plurality of fasteners in each concrete side panel comprises attaching each fastener to a respective reinforcing frame.

41. A concrete construction block comprising:
  a pair of opposing spaced apart concrete side panels, each concrete side panel extending in a first direction and a second orthogonal direction and comprising
    a reinforcing wire mesh therein, and
    a reinforcing frame adjacent said reinforcing wire mesh;
  a plurality of fasteners attached to said reinforcing frame and arranged in opposing pairs in the first direction and in the second direction; and
  a respective panel coupler extending between each opposing pair of fasteners for holding said pair of concrete side panels in the opposing spaced apart relation, said respective panel couplers being arranged in pairs in the first direction and in the second direction, each panel coupler comprising a pair of support plates secured to its respective opposing pair of fasteners and an attachment member extending between said pair of support plates.

42. A concrete construction block according to claim 41, wherein said plurality of fasteners in each concrete side panel comprises four.

43. A concrete construction block according to claim 41, wherein each fastener comprises a threaded bolt extending inwardly toward the opposing spaced apart concrete side panel.

44. A concrete construction block according to claim 43, further comprising a plurality of nuts for engaging respective threaded bolts.

45. A concrete construction block according to claim 41, wherein each attachment member defines at least one recess for receiving a reinforcing bar.

46. A concrete construction block according to claim 41, wherein said opposing pairs of fasteners comprises at least one upper opposing pair of fasteners in an upper portion of said respective concrete side panels, and at least one lower opposing pair of fasteners in a lower portion of said respective concrete side panels.

47. A concrete construction block according to claim 46, wherein said plurality of panel couplers comprises:

- at least one upper panel coupler for said at least one upper opposing pal of fasteners, with said respective attachment member defining at least one recess in a first direction for receiving a first reinforcing bar; and
- at least one lower panel coupler for said at least one lower opposing pair of fasteners, with said respective attachment member defining at least one recess in a second direction opposite the first direction for receiving a second reinforcing bar.

48. A concrete construction block according to claim 46, wherein said plurality of panel couplers comprises:

- at least one upper panel coupler for said at least one upper opposing pair of fasteners, with said respective attachment member defining at least one recess in a first direction for receiving a first reinforcing bar; and
- at least one lower panel coupler for said at least one lower opposing pair of fasteners, with said respective attachment member defining at least one recess in the first direction for receiving a second reinforcing bar.

49. A concrete construction block comprising:

- a pair of opposing spaced apart concrete side panels;
- a plurality of fasteners carried by said concrete side panels including a plurality of upper opposing pairs of fasteners in an upper portion of each side panel, and a plurality of lower opposing pairs of fastener in a lower portion of each side panel; and
- a respective upper panel coupler extending between each upper opposing pair of fasteners, and a respective lower panel coupler extending between each lower opposing pair of fasteners for holding said pair of concrete side panels in the opposing spaced apart relation, each panel coupler comprising a pair of support plates secured to its respective opposing pair of fasteners and an attachment member extending between said pair of support plates,
- said attachment member for each upper panel coupler defining at least one recess in a first direction for receiving a first reinforcing bar, and said attachment member for each lower panel coupler defining at least one recess in a second direction opposite the first direction for receiving a second reinforcing bar.

50. A concrete construction block according to claim 49, wherein said plurality of fasteners in each concrete side panel comprises four.

51. A concrete construction block according to claim 49, wherein each fastener comprises a threaded bolt extending inwardly toward the opposing spaced apart concrete side panel.

52. A concrete construction block according to claim 51, further comprising a plurality of nuts for engaging respective threaded bolts.

53. A construction block according to claim 49, wherein each concrete side panel comprises a reinforcing wire mesh therein.

54. A concrete construction block according to claim 53, wherein each concrete side panel comprises a reinforcing frame adjacent said wire mesh; and wherein said plurality of fasteners are attached to said reinforcing frame.

* * * * *